United States Patent [19]
Yamada et al.

[11] Patent Number: 5,850,356
[45] Date of Patent: Dec. 15, 1998

[54] SIMULATION APPARATUS FOR OPTIMIZING SPUTTERING APPARATUS AND SIMULATION METHOD THEREFOR

[75] Inventors: Hiroaki Yamada; Toshiyuki Ohta; Toshiki Shinmura, all of Tokyo, Japan

[73] Assignee: NEC Corporation, Tokyo, Japan

[21] Appl. No.: 713,495

[22] Filed: Sep. 13, 1996

[30] Foreign Application Priority Data

Mar. 13, 1996 [JP] Japan .................................... 8-055682

[51] Int. Cl.[6] .................................................. G06F 19/00
[52] U.S. Cl. ...................................... 364/578; 204/298.01
[58] Field of Search .................................... 364/578, 512; 204/298.01; 399/500

[56] References Cited

PUBLICATIONS

S. Valkealahti et al., "Modecular dynamics dimulation of the damage production in AI (110) Surface with slow argon ions", Nuclear Instruments and Methods in Physics Research, B18, 1987, pp. 365–369.

F. Baumann et al., "3D Modeling of sputter and reflow processes for interconnect metals", IEEE, pp. 4.4.1–4.4.4, 1995.

S. Dew et al., "Simulation of Elevated Temperature Aluminum Metallization Using SIMBAD", IEEE, pp. 1599–1606, 1992.

S. Valkealahti et al., "Molecular dynamics Simulation of the Damage . . . Surface with Slow Argon Ions", *Nuclear Instruments and Methods in Physics Research,* B18, 1987, pp. 365–369.

*Primary Examiner*—Kevin J. Teska
*Assistant Examiner*—A. S. Roberts
*Attorney, Agent, or Firm*—Sughrue, Mion, Zinn, Macpeak & Seas, PLLC

[57] ABSTRACT

A simulation apparatus for simulating and optimizing a configuration of a sputtering apparatus including a target surface temperature calculating unit for calculating a temperature of a target surface in consideration of cooling of the target, an atom initial velocity calculating unit for calculating an initial velocity of atoms within the target based on the calculated target surface temperature, an ion incidence rate calculating unit for calculating an incidence rate of the incident ions into the target to determine a position at which the incident ions collide against the target, an atom trajectory calculating unit for obtaining trajectories of atoms within the target based on each of calculation results and a sputtered atom ejection angle distribution unit for extracting sputtered atoms based on the calculation results to obtain ejection angle distribution.

19 Claims, 5 Drawing Sheets

SIMULATION APPARATUS FOR OPTIMIZING SPUTTERING APPARATUS AND SIMULATION METHOD THEREFOR

BACKGROUND OF THE INVENTION

1. Field of the Invention

The present invention relates to a simulation apparatus for optimizing a sputtering apparatus and a simulation method therefor and, more particularly, to a simulation apparatus aimed for the reduction of error in simulation and the reduction of simulation time and a simulation method therefor.

2. Description of the Related Art

In recent years, as the number of elements mounted on a semiconductor integrated circuit device increases to enhance miniaturization of elements, development of techniques for embedding in microscopic closed portion is more demanding. To solve this problem, optimization of a sputtering apparatus is necessary. However, actual development and experiments of a sputtering apparatus require enormous costs and time for development. Consideration is therefore being given to optimization of a sputtering apparatus by simulation using a computer system In optimization of a sputtering apparatus, the higher an aspect ratio becomes as elements are made smaller in size, the more demanding improvement is not only in the configuration of devices such as a collimator but also in distribution of particles ejected from a target. One of conventional simulation techniques which satisfy these demands is recited, for example, in the literature "Nuclear Instruments and Methods in Physics Research B18 (1987) 365–369" (S. VALKEALAHTI and R. M. NIEMINEN). The literature recites a simulation technique by molecular dynamics. FIG. 6 shows a flow chart of this conventional art.

In this case, it is assumed that a surface temperature (Ts) of a target is first determined and that simulation follows the Maxwell distribution at this temperature (Step 601). Then, velocity of a target atom is obtained by the Box-Muller Method according to the Expressions 1 and 2 by using uniform random numbers e1 and e2 and the obtained velocity is sequentially applied to X, Y and Z components (Step 602).

$$V_{Ti1} = \sqrt{-2\left(\frac{kTs}{M_1}\right)\ln e_1}\ \cos(2\pi e_2) \tag{1}$$

$$V_{Ti2} = \sqrt{-2\left(\frac{kTs}{M_1}\right)\ln e_1}\ \sin(2\pi e_2) \tag{2}$$

Then, velocity of argon ions is obtained according to the Expression 3 based on a voltage applied to the target.

$$V_{Ar} = \sqrt{\frac{2V}{m}} \tag{3}$$

Here, it is assumed that argon ions are injected vertically into a target surface. Then, argon ions are set to uniformly impinge on the target (Step 604).

An initial acceleration of target atoms at the time t=0 when a voltage is applied is set to be "0" (Step 605) to calculate velocities and accelerations of the argon ions within the target and the target atoms at an interval of $\Delta t$ seconds by molecular dynamics (Step 606). Here, trajectories of an atom within a target based on molecular dynamics will be described.

Orbits of atoms within a target are obtained by solving, with numerical analyses, the Newton's equation of motion based on a two-body potential.

First, position $r(t+\Delta t)$ after $\Delta t$ seconds and a velocity $v(t+\frac{1}{2}\Delta t)$ after $\frac{1}{2}\Delta t$ seconds are obtained according to the following Mathematical Expressions 4 and 5 by using the position $r(t)$, velocity $v(t)$ and acceleration $a(t)$ of the atom at the time t.

$$r(t+\Delta t) = r(t) + \Delta t v(t) + \frac{1}{2}\Delta t^2 a(t) \tag{4}$$

$$v\left(t + \frac{1}{2}\Delta t\right) = v(t) + \frac{1}{2}\Delta t a(t) \tag{5}$$

Then, from $r(t+\Delta t)$, acceleration after $t+\Delta$ seconds is obtained as a sum of two-body potentials between atoms according to the following expression.

$$a_i(t+\Delta t) = \frac{1}{m} \sum_{\substack{j=1 \\ j \neq i}}^{N} \frac{\phi(r_{ij}(t+\Delta t))}{dr} \tag{6}$$

Then, from the Mathematical Expressions 4 and 5, velocity at the time $t+\Delta t$ is obtained according to the following Expression 7.

$$v(t+\Delta t) = v\left(t + \frac{1}{2}\Delta t\right) + \frac{1}{2}\Delta t a(t+\Delta t) \tag{7}$$

Here, used as a two-body potential between atoms within the target is a Morse potential.

$$\phi(r_{ij}) = D(1 - e^{-a(r_{ij}-r_0)})^2 - D \tag{8}$$

In addition, used as potentials between the target atoms and the argon ions are:

$$\phi(r_{ij}) = \frac{Z_1 Z_2 e^2}{r_{ij}} \phi_u\left(\frac{r_{ij}}{a_u}\right) \tag{9}$$

$$\phi_u(x) = 0.18 e^{-3.2x} + 0.51 e^{-0.94x} + 0.28 e^{-0.40x} + 0.028 e^{-0.20x} \tag{10}$$

Here, target temperature calculated assuming that argon ions collide against the target with a velocity of the argon ions obtained from the voltage applied to an electrode is too high as compared with an actual temperature obtained at actual collision of argon ions against such target. It is therefore necessary to multiply each velocity of argon ions within the target and that of the target atoms by a coefficient less than 1 to reduce the velocities in order to prevent temperature of the target from increasing too high (Step 607). Then, surface temperature of the target is calculated based on the velocities of the argon ions within the target and the target atoms, and when the calculated surface temperature is too high, another calculation is conducted from the beginning (Step 608).

After the foregoing calculation is executed, regarding atoms spaced apart from the target surface by a cut-off distance as having been sputtered, the number of target atoms faster than a fixed velocity (2000 m/sec. for titanium) is searched for every time step to complete calculation of the results of the collision of the argon ions against the target at the time point when atoms in question number zero. Calculation of an trajectory after next $\Delta t$ seconds will be repeated until the atoms in question number zero (Step 609).

Next, until the number of sputtered particles reach the set number, calculation will be repeated starting with the determination of a target surface temperature (Step 610). Then, at a time point when the number of sputtered atoms reaches the set number, the above calculation is completed to store each target atom ejected from the target to have ejection angle distribution of the target atoms (Step 611). Using the ejection angle distribution, sputtering configuration will be simulated by the Monte Carlo method.

Sputtering configuration simulation by the Monte Carlo method is, for example, recited in the literature "Sputter Target Ejection Angle Distribution Simulation with Molecular Dynamics" (Hiroaki Yamada et al., THE INSTITUTE OF ELECTRONICS, INFORMATION AND COMMUNICATION ENGINEERS; TECHNICAL REPORT OF IEICE, ED95-75 (1995–9), no detailed description of which will be made because it is not relevant to the present invention.

As described in the foregoing, conventional techniques for simulating sputtering apparatus solve the problem that collision of argon ions against a target will have too high a calculated temperature of a target surface, by multiplying the velocity of argon ions by a coefficient less than 1 to reduce the velocity. However, in this method, the velocity of argon ions in simulation differs from that of argon ions which collide against a target in practice, which latter velocity is higher than the former one. As a result, velocity and direction of target atoms ejected from the target upon collision of argon ions change, which makes a state different from that where atoms are actually ejected from the target. Configuration simulation results based on these results fail to coincide with an actual configuration. With a high aspect ratio, in particular, this shortcoming is acute.

Another shortcoming is that enormous calculation time is required because when calculated temperature of a target surface is too high, another calculation is to be conducted.

SUMMARY OF THE INVENTION

A first object of the present invention is to provide a simulation apparatus and a simulation method which can obtain simulation results with reduced error by establishing a model for cooling a target to avoid the necessity of multiplying the velocity of atoms within the target by a coefficient less than 1 for adjustment.

A second object of the present invention is to provide a simulation apparatus and a simulation method by which a calculation time can be reduced through avoidance of the necessity of multiplying the velocity of atoms within a target by a coefficient less than 1 for adjustment and avoidance of calculation of a target surface temperature.

A third object of the present invention is to provide a simulation apparatus and a simulation method which can realize further reduction of a calculation time by obtaining the velocity of atoms within a target by a table reference method to use a table showing a relationship between an graduation of a two-body potential and a distance from the atoms.

According to one aspect of the invention, a simulation apparatus for simulating and optimizing a configuration of a sputtering apparatus by obtaining distribution of angles of target atoms ejected from a target of the sputtering apparatus by using a computer, comprises target surface temperature calculating means for calculating a temperature of the surface of said target in consideration of cooling of said target;

atom initial velocity calculating means for calculating an initial velocity of atoms within said target based on said calculated target surface temperature;

ion incident rate calculating means for calculating an incidence rate of incident ions into said target to determine a position at which the incident ions collide against the target;

atom trajectory calculating means for obtaining trajectories of atoms within said target based on the calculation results of each of said means; and ejection angle distribution calculating means for extracting sputtered atoms based on the calculation results of said atom trajectory calculating means to obtain ejection angle distribution.

In the preferred construction, the target surface temperature calculating means calculates the temperature of said target surface by thermal analyses taking cooling of said target into consideration.

In the preferred construction, the target surface temperature calculating means obtains a temperature Ts of a target surface according to the following one-dimensional heat conduction equation, with an applied voltage denoted as W, an area of the target as A, a thickness of titanium as a target as DTi, a thickness of an aluminum base as DAl, a heat conductivity of titanium as KTi, a heat conductivity of aluminum as KAl and a temperature of cooling water as T0:

$$Ts=(W/A)((DTi/KTi)+(DAl/KAl))+T0 \quad (11)$$

In the above-mentioned construction, the atom trajectory calculating means obtains trajectories of atoms within said target by molecular dynamics using calculation results of each of said means.

Also, the target surface temperature calculating means calculates the temperature of said target surface by thermal analyses taking cooling of said target into consideration, and the atom trajectory calculating means obtains trajectories of atoms within said target by molecular dynamics using calculation results of each of said means.

In another preferred construction, the atom trajectory calculating means obtains acceleration of atoms within said target by a table reference method using a table showing a relationship between an graduation of a two-body potential and a distance between atoms.

In another preferred construction, the target surface temperature calculating means calculates the temperature of said target surface by thermal analyses taking cooling of said target into consideration, and the atom trajectory calculating means obtains trajectories of atoms within said target by molecular dynamics using the calculation results of each of said means.

According to another aspect of the invention, a simulation method for simulating and optimizing a configuration of a sputtering apparatus by obtaining a distribution of angles of target atoms ejected from a target of the sputtering apparatus by using a computer, comprising the steps of:

a first step of calculating a temperature of the surface of said target in consideration of cooling of said target;

a second step of calculating an initial velocity of atoms within said target based on said calculated target surface temperature;

a third step of calculating an incidence rate of incident ions into said target to determine a position at which the incident ions collide against the target;

a fourth step of obtaining trajectories of atoms within said target based on the calculation results of each of said means; and a fifth step of extracting sputtered atoms based on the calculation results of said atom trajectory calculating means to obtain ejection angle distribution.

In the above-mentioned construction, the first step of calculating the temperature of said target surface includes a step of calculating a temperature of said target surface by thermal analyses taking cooling of said target into consideration.

In this case, the first step of calculating a temperature of said target surface includes a step of obtaining a temperature Ts of the target surface according to the following one-dimensional heat conduction equation, with an applied voltage denoted as W, an area of the target as A, a thickness of titanium as a target as DTi, a thickness of an aluminum base as DAl, a heat conductivity of titanium as KTi, a heat conductivity of aluminum as KAl and a temperature of cooling water as T0:

$$Ts=(W/A)((DTi/KTi)+(DAl/KAl))+T0 \qquad (11)$$

In another preferred construction, the fourth step of calculating trajectories of said target atoms includes a step of obtaining trajectories of atoms within said target by molecular dynamics using the calculation results of each of said means.

Also, the fourth step of calculating trajectories of said target atoms further comprises the steps of setting, to zero, an initial acceleration of a target atom at t=0 when voltage is applied, and calculating position, velocity and acceleration of atoms within the target after r=t+Δt.

Also, the fourth step of calculating trajectories of said target atoms includes a step of obtaining acceleration of atoms within said target by a table reference method using a table showing a relationship between an graduation of a two-body potential and a distance between atoms.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

Figure 1:
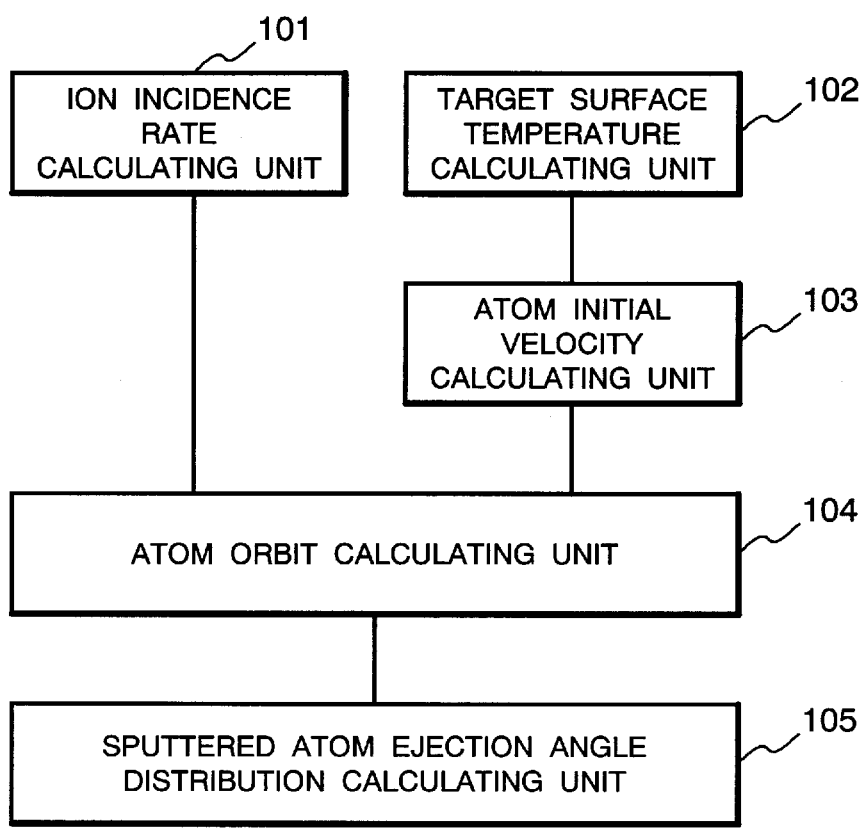
FIG. 1 is a diagram showing structure of a simulation apparatus according to one embodiment of the present invention.

Preferred embodiment of the present invention will be described in detail in the following with reference to the accompanying drawings. FIG. 1 is a diagram showing structure of a simulation apparatus for optimizing a sputtering apparatus according to one embodiment of the present invention.

As shown in the figure, the simulation apparatus of the present embodiment includes an ion incidence rate calculating unit 101 for calculating an incidence rate of ions to be injected into a target, a target surface temperature calculating unit 102 for calculating a target surface temperature through thermal analyses, an atom initial velocity calculating unit 103 for calculating an initial velocity of atoms within the target based on the target surface temperature, an atom trajectory calculating unit 104 for calculating trajectories of atoms within the target based on these results by molecular dynamics, and a sputtered atom ejection angle distribution calculating unit 105 for extracting sputtered atoms to obtain ejection angle distribution.

Figure 2:
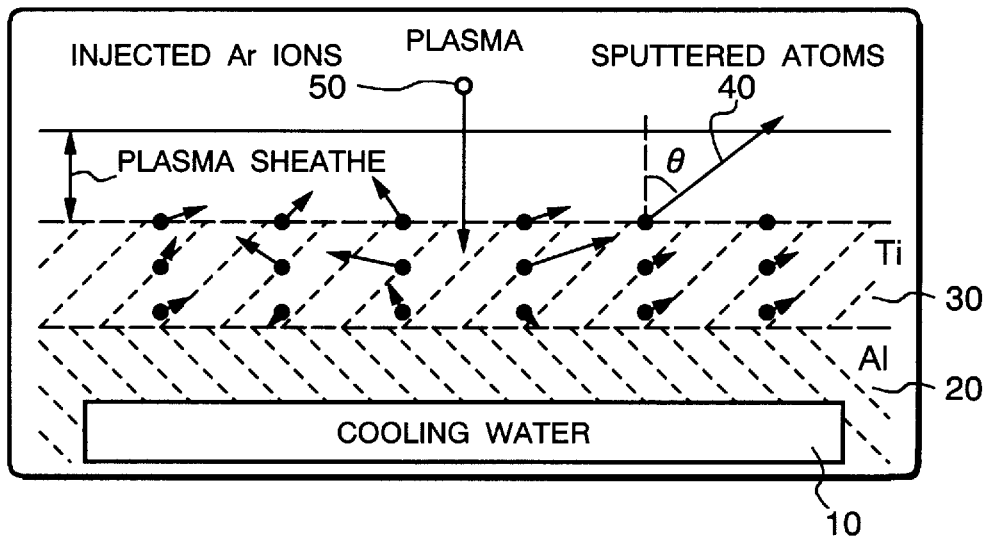
FIG. 2 is a schematic diagram showing structure of a target unit for use in the present embodiment.

Next, FIG. 2 schematically shows structure of a target unit. With reference to the figure, a target metal 30 is disposed on an aluminum base 20 cooled at a fixed temperature by a cooling water 10. Then, incident ions 50 collide against the surface of the target metal 30 to eject a sputtered atom 40 from the target metal 30. In the following, description will be given of a case where titanium (Ti) is used as a target metal and argon ions are used as incident ions as illustrated in the figure.

The ion incidence rate calculating unit 101, which is implemented by a program-controlled CPU or the like, calculates an incidence rate of incident ions and an angle of incidence into a target. First, velocity of the incident ions is obtained with the above Mathematical Expression 3 based on a voltage applied to the target. In the present embodiment, as well as conventional art, it is assumed that ions are injected vertically into the target surface. Then, position is determined at which the incident ions collide against the target. In this embodiment, as well as conventional art, the incident ions are set to uniformly collide against the target. In practice, incident ions are collided against the target which is assumed to be single crystal.

Figure 3:
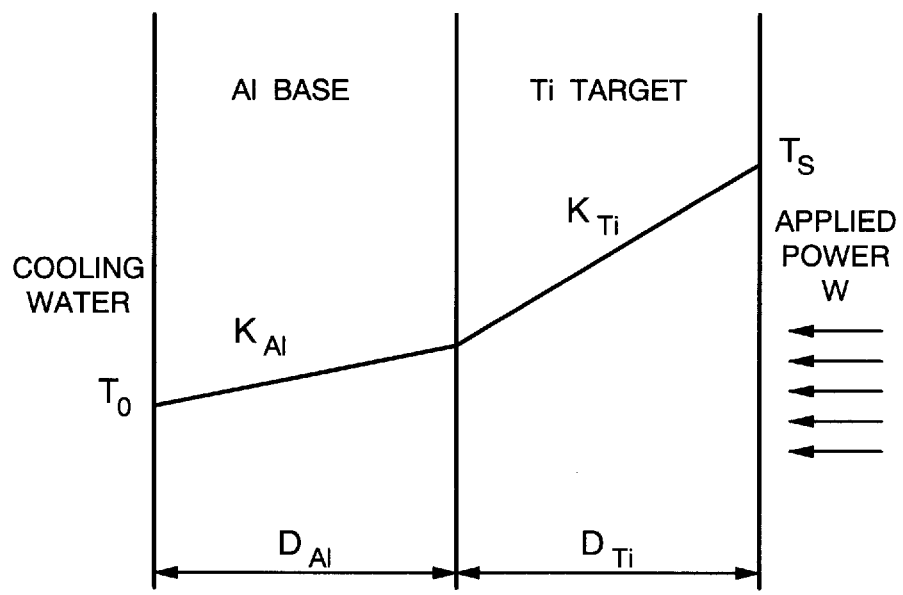
FIG. 3 is a schematic diagram showing resultant surface temperatures of the target obtained through thermal analyses.

The target surface temperature calculating unit 102, which is implemented by a program-controlled CPU or the like, calculates a surface temperature of the target by thermal analyses. FIG. 3 is a schematic diagram showing the surface temperatures Ts of the target obtained through thermal analyses. With an applied voltage denoted as W, an area of the target as A, a thickness of titanium as a target as DTi, a thickness of an aluminum base as DAl, a heat conductivity of titanium as KTi, a heat conductivity of aluminum as KAl and a temperature of a cooling water as T0, a temperature Ts of the target surface will be represented by the following expression resulting from a one-dimensional heat conductivity equation.

$$Ts=(W/A)((DTi/KTi)+(DAl/KAl))+t0 \qquad (11)$$

The atom initial velocity calculating unit 103, which is implemented by a program-controlled CPU or the like, obtains a velocity of target atoms based on a target surface temperature. In other words, the unit 103 obtains a velocity VTix of target atoms by the Box-Muller method based on a target surface temperature obtained by the above Expression 11, using uniform random numbers e1 and e2 and the above Expressions 1 and 2. Random numbers used in the Expressions 1 and 2 can be generated by various methods. For example, C language library function drand48 can be used which generate pseudo-random numbers by using linear congruence formula algorithms and 48-bit integer operation.

The atom trajectory calculating unit 104, which is implemented by a program-controlled CPU or the like, calculates trajectories of atoms within a target by molecular dynamics. Here, calculation of atom trajectories is comprised of a first step of setting, to "0", an initial acceleration of target atoms at t=0 when a voltage is applied and a second step of calculating a position, a velocity and an acceleration of atoms within the target after r=t+Δt. At the second step, position, velocity and acceleration of atoms are calculated in the same manner as in conventional art. Since the temperature of the target is calculated in advance by the target surface temperature calculating unit 102 in consideration of cooling, the calculated target surface temperature never goes higher than actual temperatures. It is therefore unnecessary, unlike conventional art, to adjust the velocity by multiplying it by a coefficient less than 1.

The atom trajectory calculating unit 104 regards an atom apart from the target surface by a cut-off distance as being sputtered. Then, the unit searches for the number of target atoms whose velocity is higher than a fixed one (2000 m/sec. for titanium) every unit time Δt. At the time point when the target atoms in question number zero, the unit 104 completes calculation of trajectories of the target atoms as the results of collision of the argon ions in question against the target. Calculation of trajectories of the target atoms after next Δt seconds will be repeated until the target atoms faster than a fixed velocity number zero. The atom trajectory calculating unit 104 further repeats the foregoing calculation to complete calculation at a time point when the number of sputtered atoms reaches a predetermined number.

The sputtered atom ejection angle distribution calculating unit 105, which is implemented by a program-controlled CPU or the like, stores each target atom ejected from the target to obtain target atom ejection angle distribution. With this ejection angle distribution, sputtering configuration is simulated by the Monte Carlo method.

Figure 4:
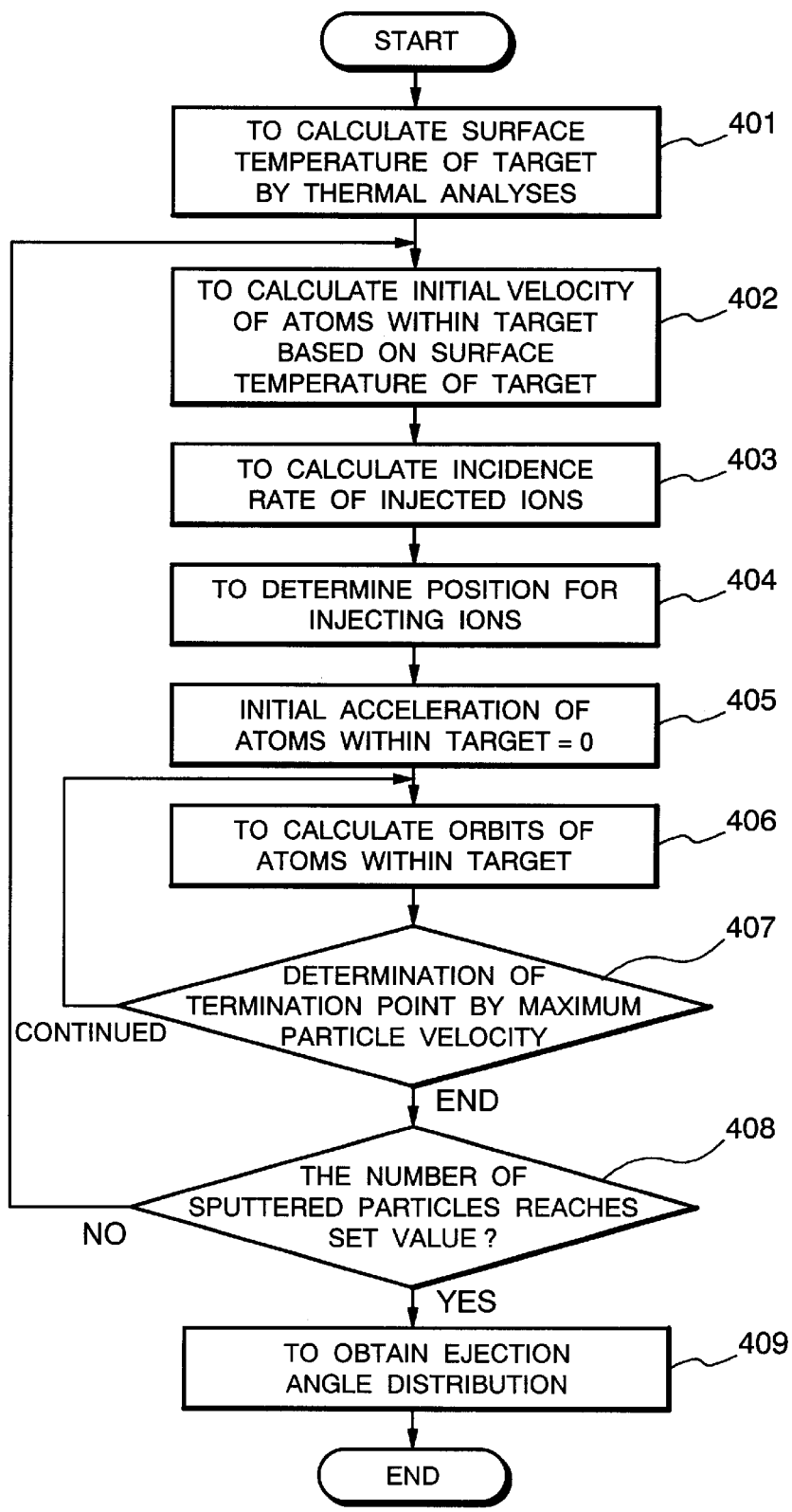
FIG. 4 is a flow chart showing operation by a simulation method according to the present embodiment.

Next, operation of the present embodiment will be described with reference to the flow chart shown in FIG. 4.

First, the target surface temperature calculating unit 102 calculates a surface temperature of the target by thermal analyses based on an initial value given in advance (Step 401). Subsequently, based on the target surface temperature calculated by the target surface temperature calculating unit 102, the atom initial velocity calculating unit 103 obtains an initial velocity of the target atoms by the Box-Muller method (Step 402).

Then, the ion incidence rate calculating unit 101 calculates an incidence rate of ions injected into the target (Step 403) to determine a position at which the incident ions collide against the target (Step 404).

Then, the atom trajectory calculating unit 104 calculates trajectories of the atoms within the target by molecular dynamics. In other words, the unit 104 first sets, to 0, an initial acceleration of a target atom at t=0 when a voltage is applied (Step 405) and then calculates position, velocity and acceleration of the atoms within the target after r=t+Δt based on the above calculated velocity of the atoms within the target, incidence rate of the incident ions and position at which the ions collide against the target (Step 406). Then, every unit time of Δt seconds, calculation of trajectories after a lapse of the time will be repeated until the target atoms faster than a fixed velocity (2000 m/sec. for titanium) number zero (Step 407).

Calculation at the foregoing Steps 403 to 406 will be repeated until the number of sputtered atoms reach a predetermined number and completed at a time point when the number reaches the predetermined number (Step 408).

Thereafter, the sputtered atom ejection angle distribution calculating unit 105 stores each target atom ejected from the target to obtain target atom ejection angle distribution (Step 409) and based on the results, simulates a sputtering configuration by the Monte Carlo method.

Figure 5:
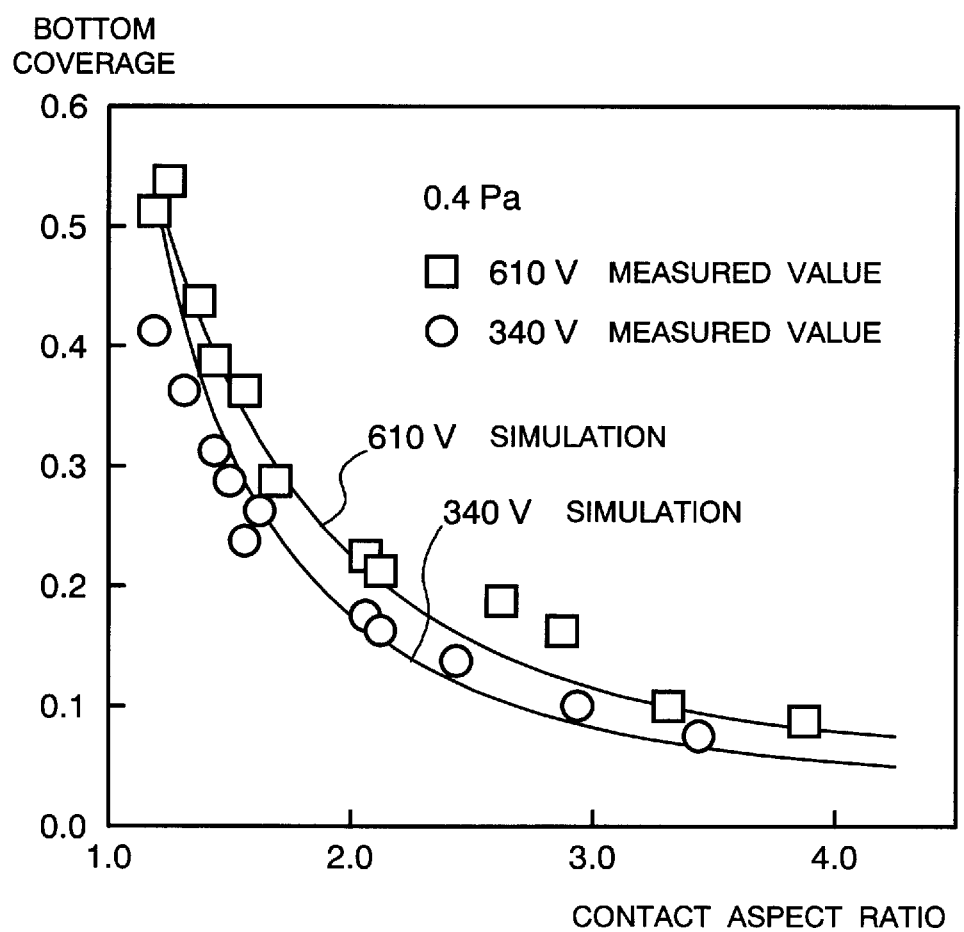
FIG. 5 is a diagram showing an example of simulation results of sputtering configuration obtained by using a distribution of ejection angles of atoms within the target calculated according to the present embodiment.
Figure 6:
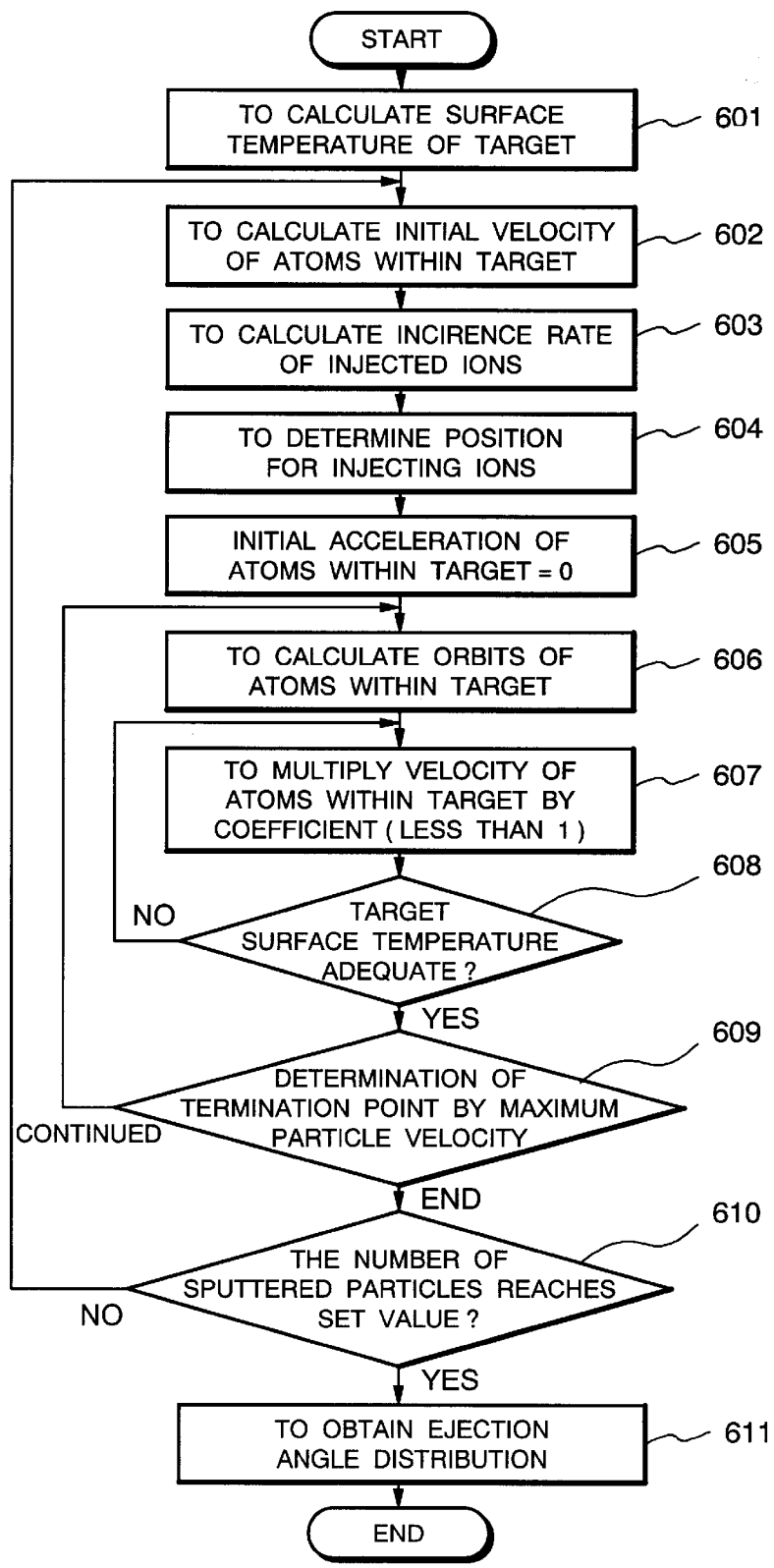
FIG. 6 is a flow chart showing operation by a conventional simulation method.

Results of the simulation of sputtering configuration obtained by the foregoing processing are shown in FIG. 5. In this embodiment, since a logical value of an actual velocity of an atom never differ from a calculated value, adjustment by multiplying a velocity of an atom within the target by a coefficient less than 1 is unnecessary. Angle and velocity of atoms ejected from the target accordingly never differ from their logical values, so that simulation results can be obtained with reduced error. In the illustrated example, with an aspect ratio of 4, calculation is possible with a difference within 10 percent from an actual bottom coverage.

In addition, since the present invention requires neither adjustment by multiplying a velocity of atoms within a target by a coefficient less than 1 nor calculation of a target surface temperature, calculation time can be reduced to approximately one-third of that of conventional art. Moreover, the present embodiment further enables a calculation time to be reduced down to some one-sixth by obtaining an acceleration of atoms within a target by a table reference method, using a table showing a relationship between graduation of a two-body potential obtained according to the above-described Mathematical Expressions 8 and 9 and a distance from atoms.

As described in the foregoing, since in the simulation apparatus for a sputtering apparatus and the simulation method therefor according to the present embodiment, a target cooling model is established to calculate a state of heat generated by the collision of incident ions against the target through thermal analyses and determine a velocity of atoms within the target, there is no need to adjust a velocity of atoms within the target by multiplying the velocity by a coefficient less than 1, which is necessary in conventional art. Simulation of a sputtering configuration using an ejection angle distribution obtained by the present invention therefore can obtain simulation results with reduced error.

The present invention has a further advantage that a calculation time can be drastically reduced because neither is necessary adjustment by multiplication of a velocity of atoms within a target by a coefficient less than 1 nor calculation of a target surface temperature.

Moreover, further reduction in calculation time can be realized by obtaining an acceleration of atoms within a target by a table reference method, using a table showing a relationship between an graduation of a two-body potential and a distance from atoms.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A simulation apparatus for simulating and optimizing a configuration of a sputtering apparatus by obtaining distribution of angles of target atoms ejected from a target of the sputtering apparatus by using a computer, comprising:

target surface temperature calculating means for calculating a temperature of the surface of said target in consideration of cooling of said target;

atom initial velocity calculating means for calculating an initial velocity of atoms within said target based on said calculated target surface temperature;

ion incidence rate calculating means for calculating an incidence rate of incident ions into said target to determine a position at which the incident ions collide against be target;

atom trajectory calculating means for obtaining trajectories of atoms within said target based on the calculation results of each of said means;

ejection angle distribution calculating means for extracting sputtered atoms based on the calculation results of said atom trajectory calculating means to obtain ejection angle distribution and means for outputting said ejection angle distribution.

2. The simulation apparatus as set forth in claim 1, wherein said target surface temperature calculating means calculates the temperature of said target surface by thermal analyses taking cooling of said target into consideration.

3. The simulation apparatus as set forth in claim 1, wherein said target surface temperature calculating means obtains a temperature Ts of a target surface according to the following one-dimensional heat conduction equation, with an applied voltage denoted as W, an area of the target as A, a thickness of titanium as a target as DTi, a thickness of an aluminum base as DAl, a heat conductivity of titanium as KTi, a heat conductivity of aluminum as KAl and a temperature of cooling water as T0:

$$Ts=(W/A)((DTi/KTi)+(DAl/KAl))+T0 \qquad (11).$$

4. The simulation apparatus as set forth in claim 1, wherein said atom trajectory calculating means obtains trajectories of atoms within said target by molecular dynamics using calculation results of each of said means.

5. The simulation apparatus as set forth in claim 1, wherein said target surface temperature calculating means calculates the temperature of said target surface by thermal analyses taking cooling of said target into consideration, and said atom trajectory calculating means obtains trajectories of atoms within said target by molecular dynamics using calculation results of each of said means.

6. The simulation apparatus as set forth in claim 1, wherein said atom trajectory calculating means obtains acceleration of atoms within said target by a table reference method using a table showing a relationship between an graduation of a two-body potential and a distance between atoms.

7. The simulation apparatus as set forth in claim 1, wherein said target surface temperature calculating means calculates the temperature of said target surface by thermal analyses taking cooling of said target into consideration, and said atom trajectory calculating means obtains trajectories of atoms within said target by molecular dynamics using the calculation results of each of said means.

8. A simulation method for simulating and optimizing a configuration of a sputtering apparatus by obtaining a distribution of angles of target atoms ejected from a target of the sputtering apparatus by using a computer, comprising the steps of:

a first step of calculating a temperature of the surface of said target in consideration of cooling of said target;

a second step of calculating an initial velocity of atoms within said target based on said calculated target surface temperature;

a third step of calculating an incidence rate of incident ions into said target to determine a position at which the incident ions collide against the target;

a fourth step of obtaining trajectories of atoms within said target based on the calculation results of said first, said second, and said third steps; and a fifth step of extracting sputtered atoms based on the calculation results of said fourth step to obtain an ejection angle distribution; and a sixth step of outputting siad ejection angle distribution.

9. The simulation method as set forth in claim 8, wherein said first step of calculating the temperature of said target surface includes a step of calculating a temperature of said target surface by thermal analyses taking cooling of said target into consideration.

10. The simulation method as set forth in claim 8, wherein said first step of calculating a temperature of said target surface includes a step of obtaining a temperature Ts of the target surface according to the following one-dimensional heat conduction equation, with an applied voltage denoted as W, an area of the target as A, a thickness of titanium as a target as DTi, a thickness of an aluminum base as DAl, a heat conductivity of titanium as KTi, a heat conductivity of aluminum as KAl and a temperature of cooling water as T0:

$$Ts=(W/A)((DTi/KTi)+(DAl/KAl))+T0 \qquad (11).$$

11. The simulation method as set forth in claim 8, wherein said fourth step of calculating trajectories of said target atoms includes a step of obtaining trajectories of atoms within said target by molecular dynamics using the calculation results of each of said means.

12. The simulation method as set forth in claim 8, wherein said fourth step of calculating trajectories of said target atoms further comprising the steps of:

setting, to zero, an initial acceleration of a target atom at t=0 when voltage is applied, and calculating position, velocity and acceleration of atoms within the target after r=t+Δt.

13. The simulation method as set forth in claim 8, wherein said fourth step of calculating trajectories of said target atoms includes a step of obtaining acceleration of atoms within said target by a table reference method using a table showing a relationship between an graduation of a two-body potential and a distance between atoms.

14. A computer program product for enable a simulation apparatus to simulate and optimize a configuration of a sputtering apparatus by obtaining a distribution of angles of target atoms ejected from a target of the sputtering apparatus by using a computer, comprising:

software instructions, and a computer readable medium including said software instructions;

wherein said software instructions enable said simulation apparatus to perform the steps of:

calculating a temperature of the surface of said target in consideration of cooling of said target;

calculating an initial velocity of atoms within said target based on said calculated target surface temperature;

calculating an incidence rate of incident ions into said target to determine a position at which the incident ions collide against the target;

obtaining trajectories of atoms within said target based on the calculation results of each of said means; and extracting sputtered atoms based on the calculation results of said atom trajectory calculating means to obtain ejection angle distribution.

15. The computer program product for enabling a simulation apparatus to simulate and optimize a configuration of a sputtering apparatus according to claim 14, wherein:

the software instructions define the step of calculating the temperature of said target surface so as to include a step of calculating a temperature of said target surface by thermal analyses taking cooing of said target into consideration.

16. The computer program product for enabling a simulation apparatus to simulate and optimize a configuration of a sputtering apparatus according to claim 14, wherein:

the software instructions define the step of calculating a temperature of said target surface so as to include a step of obtaining a temperature Ts of the target surface according to the following one-dimensional heat conduction equation, with an applied voltage denoted as W, an area of the target as A, a thickness of titanium as a target as DTi, a thickness of an aluminum base as DAl, a heat conductivity of titanium as KTI, a heat conductivity of aluminum as KAl and a temperature of cooling water as TO:

$$Ts=(W/A)((DTi/KTi)+(DAl/KAl))+TO \qquad (11).$$

17. The computer program product for enabling a simulation apparatus to simulate and optimize a configuration of a sputtering apparatus according to claim 14, wherein:

the software instructions define the step of calculating trajectories of said target atoms so as to include a step of obtaining trajectories of atoms within said target by molecular dynamics using the calculation results of each of said means.

18. The computer program product for enabling a simulation apparatus to simulate and optimize a configuration of a sputtering apparatus according to claim 14, wherein:

the software instructions define the step of calculating trajectories of said target atoms so as further to comprise the steps of:

setting, to zero, an initial acceleration of a target atom at t=0 when voltage is applied, and calculating position, velocity and acceleration of atoms within the target after r=t+Δt.

19. The computer program product for enabling a simulation apparatus to simulate and optimize a configuration of a sputtering apparatus according to claim 14, wherein:

the software instructions define the step of calculating trajectories of said target atoms so as to include a step of obtaining acceleration of atoms within said target by a table reference method using a table showing a relationship between an graduation of a two-body potential and a distance between atoms.

\* \* \* \* \*

UNITED STATES PATENT AND TRADEMARK OFFICE
CERTIFICATE OF CORRECTION

PATENT NO. : 5,850,356
DATED : December 15, 1998
INVENTOR(S) : Hiroaki YAMADA, Toshiyuki OHTA and Toshiki SHINMURA It is certified that error appears in the above-identified patent and that said Letters Patent is hereby corrected as shown below:

Column 2, eq. (8), delete "$\phi(r_{ij})=D(1-e^{-\alpha(rij-r0)})^2-D$" and insert --$\phi(r_{ij})=D(1-e^{-\alpha(rij-r0)})^2-D$--.

Column 6, eq. (11), delete "tO" and insert --TO--.

Column 9, line 4, delete "be" and insert --the--.

Column 10, line 10, delete "siad" and insert --said--.

Signed and Sealed this

First Day of June, 1999

Q. TODD DICKINSON

*Attest:*

*Attesting Officer*   *Acting Commissioner of Patents and Trademarks*